United States Patent

Ayanoglu et al.

[11] Patent Number: 5,600,663
[45] Date of Patent: Feb. 4, 1997

[54] ADAPTIVE FORWARD ERROR CORRECTION SYSTEM

[75] Inventors: Ender Ayanoglu, Red Bank; Richard D. Gitlin, Little Silver, both of N.J.; Thomas F. La Porta, Thornwood, N.Y.; Sanjoy Paul, Atlantic Highlands; Krishan K. Sabnani, Westfield, both of N.J.

[73] Assignee: Lucent Technologies Inc., Murray Hill, N.J.

[21] Appl. No.: 340,551

[22] Filed: Nov. 16, 1994

[51] Int. Cl.$^6$ .......................... H03M 13/00; H04L 1/18
[52] U.S. Cl. ................................. 371/41; 371/35
[58] Field of Search ................. 371/5.5, 35, 41

[56] References Cited

U.S. PATENT DOCUMENTS 4,718,066  1/1988  Rogard ..................... 371/35
5,379,305  1/1995  Weng ....................... 371/41
5,444,719  8/1995  Cox et al. ................. 371/37.1

OTHER PUBLICATIONS

Shacham, N., et al, "An Adaptive Hybrid ARQ Algorithm for Radio Channels", Int'l. Conf. on Communications, 1985, pp. 1390–1394.

Rice, M., et al., "Adaptive Error Control for Slowly Varying Channels", IEEE Trans. on Communications, vol. 42, No. 2/3/4, Feb./Mar./Apr. 1994, pp. 917–936.

Primary Examiner—Stephen M. Baker

[57] ABSTRACT

A forward error correction system adaptively changes the number of parity bits, bytes or packets transmitted to a receiver, based on previous error patterns experienced recently in the reception of original and parity bits, bytes or packets by that receiver.

18 Claims, 3 Drawing Sheets

ADAPTIVE FORWARD ERROR CORRECTION SYSTEM

TECHNICAL FIELD

This invention relates to wireless forward error correction in data transmission, and more particularly to a system to adaptively change the number of redundant data packets transmitted to a receiver based on previous error patterns.

BACKGROUND OF THE INVENTION

Forward Error Correction (FEC) techniques allow a receiver to reconstruct missing or corrupted bits, bytes or packets from redundant (also known as "parity") bits, bytes or packets transmitted thereto with the original bits, bytes or data packets. According to an exemplary forward error correction technique described in U.S. Pat. No. 5,007,067, m bits are copied from each packet within a window of N packets to be included in M parity packets. N+M packets are then coded for transmission to a receiver. Hence, as long as N packets out of the N+M packets are received, the original N packets can be reconstructed if one or more packet is lost or corrupted in transit.

Traditionally, forward error correction (FEC) techniques have seldom been used for data transmission. The reluctance by software and hardware designers to use FEC techniques stems from the fact that retransmission schemes, such as Automatic Repeat request (ARQ), are either more cost-effective (given the relatively low cost of bandwidth) or more efficient because the processing delay associated with conventional retransmission schemes is typically much shorter than the delay incurred in the FEC coding and decoding process.

However, a number of factors has provided the impetus for reconsideration of the traditional preference for retransmission schemes over forward error correction techniques. Those factors include the increased speed and decreased price of processors and the emergence of certain applications for which retransmission for error recovery is undesirable or impractical. For example, some video applications by their very nature exclude the possibility of using data retransmission schemes for error recovery. Another application in which data retransmission schemes appear ill-suited for implementation is wireless data communications systems. Those systems are known for their high number of retransmissions necessitated by various sources of random noise and deterministic interference that give rise to errored receptions. The significant number of retransmissions on those wireless channels may be cost-prohibitive when one considers the relatively high cost of bandwidth for wireless data connections.

However, certain shortcomings associated with prior art FEC techniques have hampered their implementation, even for applications in which FEC enjoys technical and economical advantages over retransmission schemes. One of these shortcomings relates to the fact that the coding overhead and the cost associated with the transmission of redundant or parity bits, bytes or packets is unduly onerous when the the number of errors is low. Conversely, when the number of errors is high, the number of M parity bits, bytes or packets may be insufficient to allow reconstruction of the original N bits, bytes or packets.

SUMMARY OF THE INVENTION

The present invention is directed to a forward error correction system which adaptively changes the number of parity data symbols including bits, bytes or packets transmitted to a receiver, based on previous error patterns experienced recently in the reception of data symbols by that receiver.

In an embodiment of the principles of the invention, a transmitter encodes a number (N) of original data symbols (which may be bit, bytes or packets) by combining a selected few of the original data symbols to form a number (M) of parity data symbols. The N+M data symbols are included in a data stream transmitted to a receiver which is arranged to reconstruct the original data symbols as long as at least N of the N+M data symbols in the data stream are received therein. The receiver is also arranged to detect errors in the data stream and tabulate the number of such errors. That number is transmitted to the transmitter which adjusts the number of parity data symbols included in subsequent data streams based on that number.

DETAILED DESCRIPTION

Figure 1:
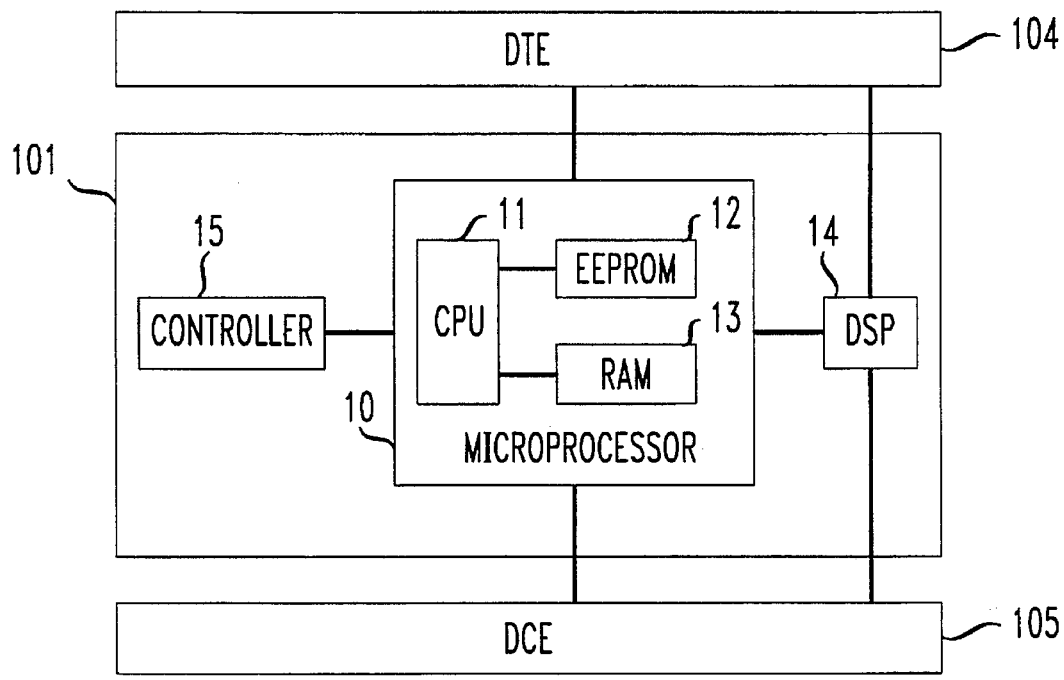
FIGS. 1 and 2 show the major components of an illustrative transmitter and an illustrative receiver, respectively, embodying the principles of the invention.
Figure 2:
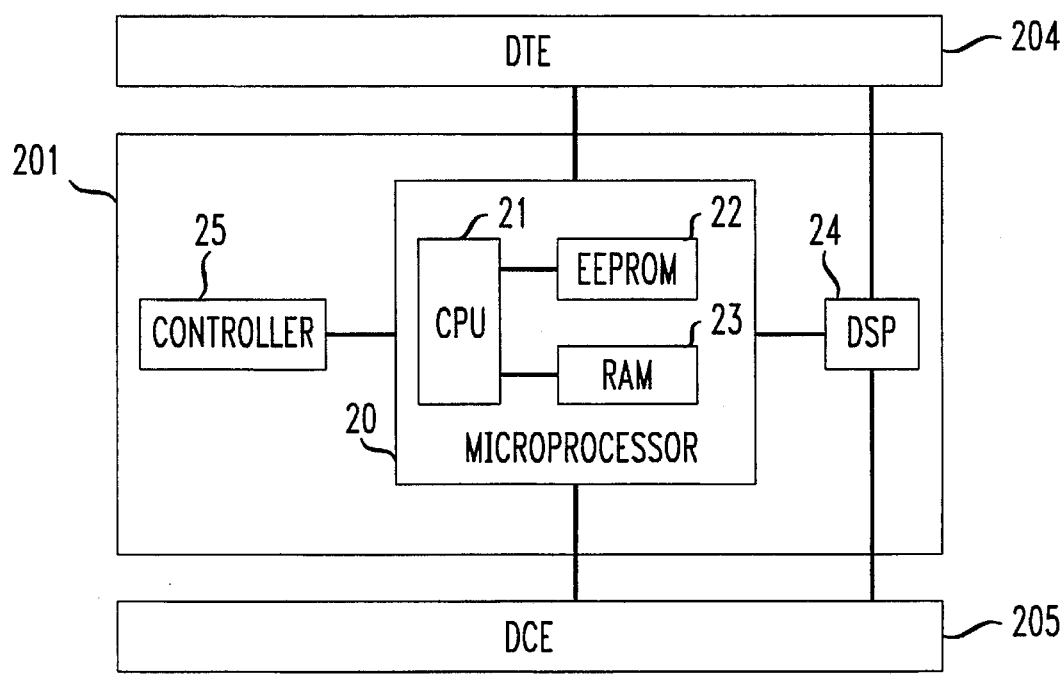

FIGS. 1 and 2 show the major components of an illustrative transmitter 101 and an illustrative receiver 201, which exchange data via a Data Terminal Equipment (DTE) 104 and a Data Communications Equipment (DCE) 105. Since transmitter 101 and receiver 201 share a common set of commercially available electronic components, the functionality of transmitter 101 and receiver is described together. Those components include a controller 15 (25) which synchronizes timing signals between the other components of transmitter/receiver 101/201, namely, a microprocessor 10 (20) and a Digital Signal Processor (DSP) 14 (24) that is coupled to microprocessor 10 (20). Controller 15 (25) also supervises and monitors the operations of microprocessor 10 (20) and DSP 14 (24) to ensure that packets are transmitted and received reliably.

Figure 3:
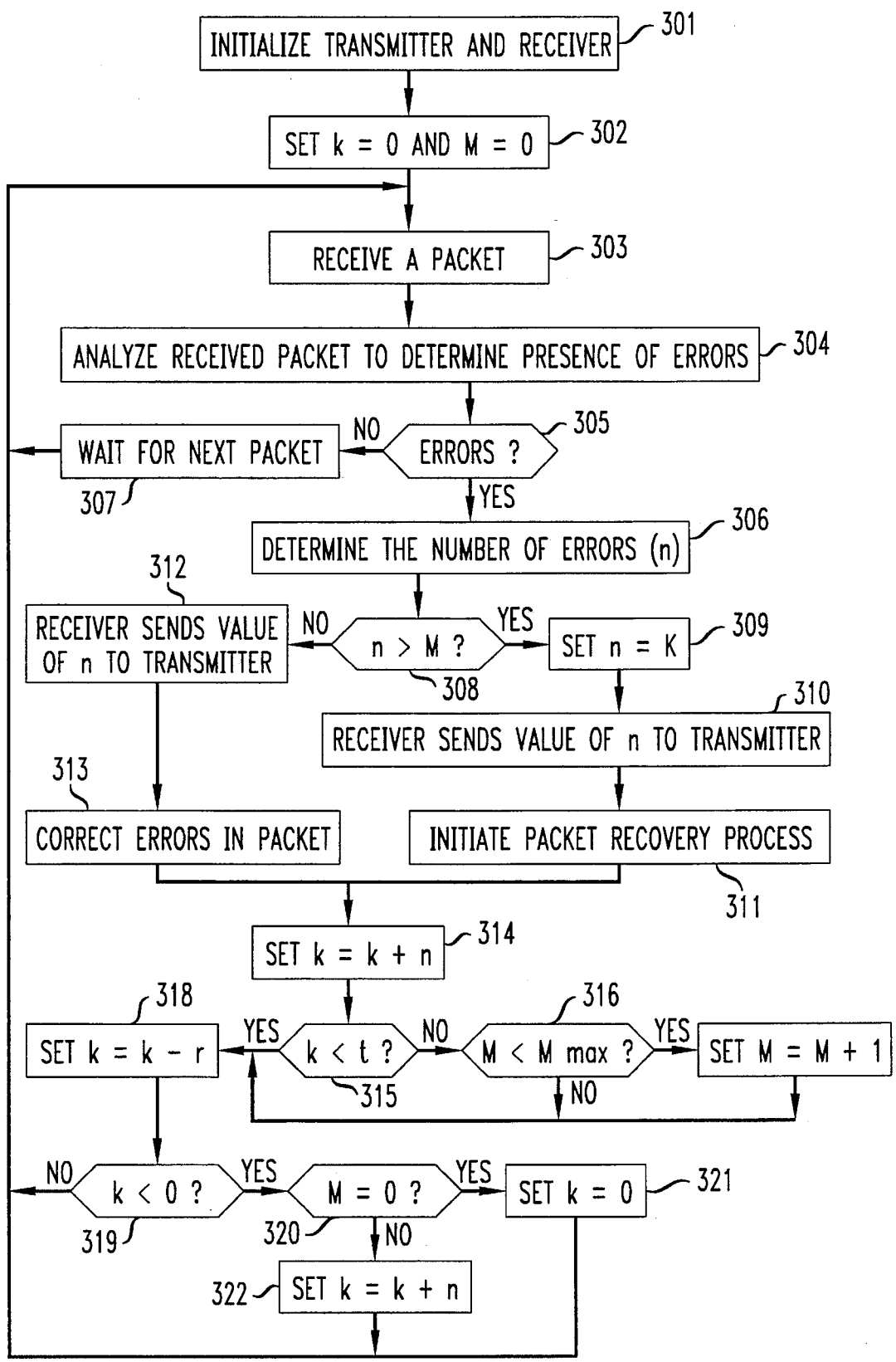
FIGS. 3 and 4 show, in flow diagram format, programmed instructions executed by different elements of the transceiver of FIG. 1 to implement the adaptive forward error correction technique of the invention.

Microprocessor 10 (20) is comprised of a Central Processing Unit (CPU) 11 (21), an EEPROM 12 (22), and a RAM 13 (23). CPU 11 is a wired-logic processing unit that executes programmed instructions stored in EEPROM 12 (22) to packetize, frame and code data for transmitter 101 to implement forward error correction schemes in accordance with the principles of the invention. Similarly, CPU 21 executes programmed instructions stored in EEPROM 22 to depacketize and decode data for receiver 201 in accordance with the principles of the invention. These programmed instructions include, for example, some of the commands that are described below and that are shown in FIGS. 2 and 3. CPU 21 scans for supervisory changes for receiver 201 in order to receive, via DCE 105, data streams forwarded thereto by transmitter 101. CPU 21 also executes instructions stored in EEPROM 22 in order to check for receiver 201 the cyclic redundancy check field that is included in every packet received by receiver 201 to determine whether the packet is received error-free. Of particular significance is the role of CPU 21 in analyzing for receiver 201 the number of errors that occurred in the transmission of packets and in notifying a transmitter, such as transmitter 201, to increase or to reduce the number of redundant bits, bytes and packets coded in a data stream by transmitter 101, based on the number of errors in those bits, bytes and packets, respectively. When errors are detected in a received data stream, CPU 21 executes instructions to correct those errors using, for example, data stored in the cyclic redundancy check field, as described in further detail below.

Digital Signal Processor 14, shown in FIG. 1 as part of transmitter 101, is responsible for all functions related to encoding and stuffing parity bits in a packet to be transmitted by transmitter 101 to a receiver similar to receiver 201. Specifically, DSP 14 implements a particular scheme of forward error correction called "bit-level FEC" described below. Digital Signal Processor 24 in receiver 201 decodes parity bits in a packet before forwarding the packet to microprocessor 20.

Also shown as a component of receiver 201 is Random Access Memory (RAM) 23 that buffers original and parity bits, bytes or packets received by receiver 201. When CPU 21 detects errors either in a packet or in bits/bytes within a packet, CPU 21 fetches the original and parity bits, bytes or packets stored in RAM 23 to correct those errors using the FEC schemes described immediately below.

From a general standpoint, programmed instructions or hardware to implement the FEC techniques of the invention can be grouped under three categorical headers, namely, bit-level FEC, byte-level FEC and packet-level FEC.

Bit-level FEC may be implemented in DSP 24 or alternatively in an Application Specific Integrated Circuit (ASIC) (not shown). For narrowband channels, prior art trellis-coded modulation techniques with well-known Viterbi decoding algorithms may be used to implement a bit-level FEC. In the case of wideband channels, bit-level FEC may be implemented by using well-known block or convolutional coding techniques in DSP 14 in conjunction with Viterbi decoding schemes implemented in DSP 24. A detailed description of the Viterbi coding and decoding principles and convolutional coding technique is provided in the book authored by Viterbi and titled *Principles of Digital Communication and Coding*, McGraw Hill, Princeton, N.J., 1979.

In this example, convolutional coding is implemented by reading bits into a shift register of DSP 14, and then transmitting to microprocessor 10 (of transmitter 201) the contents of the shift register along with parity bits that are equal to modulo-2 additions of various combinations of the contents of that shift register. The bits created by the various combinations of the shift register add redundancy into the incoming bit stream received by microprocessor 20 of receiver 201. When bit-level FEC is unable to reconstruct an original data stream from a received coded data stream, byte-level FEC may be used.

In an example of an implementation of a byte-level FEC, the conventional Cyclical Redundancy Check (CRC) field that is typically transmitted with a frame is replaced with a field that stores data used to correct errors associated with the frame. For example, the CRC field may be replaced by a code, such as the output of the well-known Reed-Solomon encoder. A description of the Reed-Solomon coding technique can be found in the book entitled *Reed-Solomon Codes and Their Applications*, edited by Wicker, Stephen and Bhargava, Vijay, IEEE Press, Piscataway, N.J., 1994. When the field size is the same as that needed for CRC, there is no additional bandwidth or coding overhead required as compared to an ARQ scheme. By increasing the size of this field, the number of packet retransmissions needed can be reduced. Advantageously, byte-level FEC allows a more efficient utilization of bandwidth since only the bytes in error are corrected. Byte-level FEC is particularly efficient when the errors occur in short bursts.

In this example, microprocessor 10 controls the operations of DSP 14 for transmitter 101 such that the number of redundant bits coded in a data stream for forward error correction purposes can be changed based on byte-level CRC measurements. For example, when a signal from receiver 201 alerts transmitter 101 that byte-level CRC measurements at that receiver indicate that recently received data streams contain a high number of errors, microprocessor 10 of transmitter 101 sends a signal to DSP 14 requesting an increase in the the number of redundant bit or bytes coded in the data streams. Conversely, when transmitter 101 receives a signal indicative of a long period of error-free data streams reflected in the byte-level CRC measurements, microprocessor 10 dictates DSP 14 to reduce the number of bits included in bit streams transmitted to receiver 201.

As mentioned above, byte-level FEC may be implemented using, for example, Reed-Solomon encoding techniques. Reed-Solomon codes introduce redundancy into an incoming bit stream, in a way similar to convolutional codes. In this example, CPU 11 of transmitter 101 executes programmed instructions stored in EEPROM 12 to implement Reed-Solomon coding techniques. A Reed-Solomon encoder a) operates on a block of small number of symbols (typically one of $2^{}4, 2^{}5, \ldots, 2^{}10$) that are equivalent to a group of bits, (typically about 4–10), and b) adds redundant symbols (or bytes). When a block is encoded, the redundant symbols are appended to the original sequence of data symbols. However, unlike Viterbi decoding, a Reed-Solomon decoder determines the presence and number of errors and the correctability of those errors, if any. When CPU 21 of receiver 201 ascertains that errors are correctable, then their number, positions, and magnitudes are determined to correct those errors. Reed-Solomon codes are known for their efficiency because the number of redundant symbols used for correcting a given number of errors is the theoretical minimum possible. For example, when N symbols are received along with M parity symbols, a Reed-Solomon decoder implemented in receiver 201** is able to reconstruct N symbols by correcting up to M/2 errors while all other encoders need more than M parity symbols to correct M/2 errors.

Packet-level FEC is implemented, for example, by adding M redundant packets to N data packets such that when at least N packets of the total N+M packets are received, the N original data packets can be recovered. In addition to the Reed-Solomon coding technique mentioned above, a diversity coding technique can also be used to implement packet-level FEC. An exemplary implementation of the diversity coding technique is described in U.S Pat. No. 5,007,067 which is incorporated herein by reference. The diversity coding technique is more efficient than the Reed-Solomon coding technique when the number of packets in a frame is small (2 to 3 packets).

Having described exemplary embodiments of each FEC scheme, it may be helpful to point out when implementation of each scheme is warranted. This distinction is needed because bit-level, byte-level and packet-level FEC require parity symbols in data streams transmitted from transmitter 101 to a receiver. Consequently, the effective throughput of a transmission channel is reduced when compared to the effective throughput of that channel without the overhead of forward error correction (regardless of which FEC scheme is used). Hence, in order to optimize bandwidth efficiency, a forward error correction scheme has to be selected based on the error characteristics of the channel transporting the data streams.

By way of example, in a wireless outdoor channel in which errors occur often within a packet, but with a small number of errors at any given time, bit-level and byte-level FEC can be effectively used without the need to implement packet-level FEC. In this case, bit-level and byte-level forward error correction are efficient since it is likely that individual bits and bytes are corrupted as opposed to entire packets being lost or corrupted. By contrast, for a wideband wireless indoor channel that has different error characteristics, bit-level and byte-level forward error correction may not be beneficial. For example, if in the data transmitted over the wideband wireless indoor channel, errors occur infrequently but with high degree of packet loss (e.g., high level of error concentration when errors do occur), packet-level FEC should be selected since entire packets are likely to be corrupted as opposed to single bits or bytes within a packet.

It is worth noting that although the implementation of the highest amount of redundancy at all levels would insure reliable transmission, this onerous transmission reliability is not desirable since it would be achieved at the cost of reduced system throughput. Thus, the system of this invention makes use of channel measurements to suitably adapt the redundancy at each level.

FIG. 3 shows the programmed instructions that are implemented to carry out the byte-level FEC technique of the invention. When receiver 201 and transmitter 101 are initialized, in step 301, parameters are pre-defined which represent a) the maximum number (M) of errors that can be corrected for a single packet, and b) a leaky bucket average of number of errors in a packet (k) received by receiver 201 and computed thereto. Following the initialization process, k is set to zero and M is set to zero, in step 302. Upon receiving a packet from transmitter 101 in step 303, receiver 201 analyzes information included in the packet, in step 304, to determine a) whether the packet has been lost or corrupted in transit, in step 305, and b) the number of errors (n) in the packet, in step 306. As mentioned above, the FEC field that may store, for example, CRC byte-level measurement data is used to determine the presence and the number of errors in a received data stream. Alternatively, n may represent the number of uncorrupted bytes received in the packet. When no errors are detected in the data stream, receiver 201 in step 307 waits for the next packet to be received from transmitter 101.

When errors are present in the data stream, the number of errors (n) is then compared to the maximum number of errors (M) that can be corrected in a packet to determine, in step 308, whether n exceeds M. If so, CPU 21 of receiver 201, in step 309, sets n to a predetermined value K. Thereafter, in step 310, receiver 201 transmits the value of n to transmitter 101. The transmission and reception of the value n triggers, in step 311, the packet recovery process which may include, for example, packet-level FEC implementation or, alternatively, retransmission of the previously coded transmitted packet. When the number of errors in the packet is less than M, receiver 201, in step 312, sends the value of n to the transmitter and proceeds, in step 313, to correct the errors in the packet using the byte-level FEC technique described above.

Transmitter 101 upon receiving the value of n adds that value to the leaky bucket average (1) in step 314. Thereafter, in step 315, the leaky bucket average is compared to a threshold value t which is a function of M t(M) and which represents the threshold at which the number of errors in a packet that can be corrected will be substantially increased (from 1 error to 10 errors, for example). If the threshold value t is less than 1, then, in step 316, the transmitter 101 determines whether the maximum number of errors that can be corrected in a packet (M) is less than $M_{max}$. If so, in step 317, M is incremented by 1 (but not to exceed $M_{max}$). The latter is a parameter which represents a maximum number of packet errors for which correction would cause delay induced by coding and decoding overhead and that is longer than equivalent delay incurred for retransmission of the packet.

If the threshold value of t is greater than 1, or regardless of whether or not M is incremented, the value of k is decremented, in step 318, by a constant r, which is a function of M r(M) and which represents the passage of time. Then a determination is made, in step 319, as to whether k is greater than zero. If so, steps 303 to 322, as needed, are repeated. If k is less than zero, a determination is then made in step 320, as to whether M is equal to zero. If so, k is set to zero in step 321. Otherwise, M is decremented by 1 in step 322. Subsequently, steps 303 to 322 are repeated, as needed.

Figure 4:
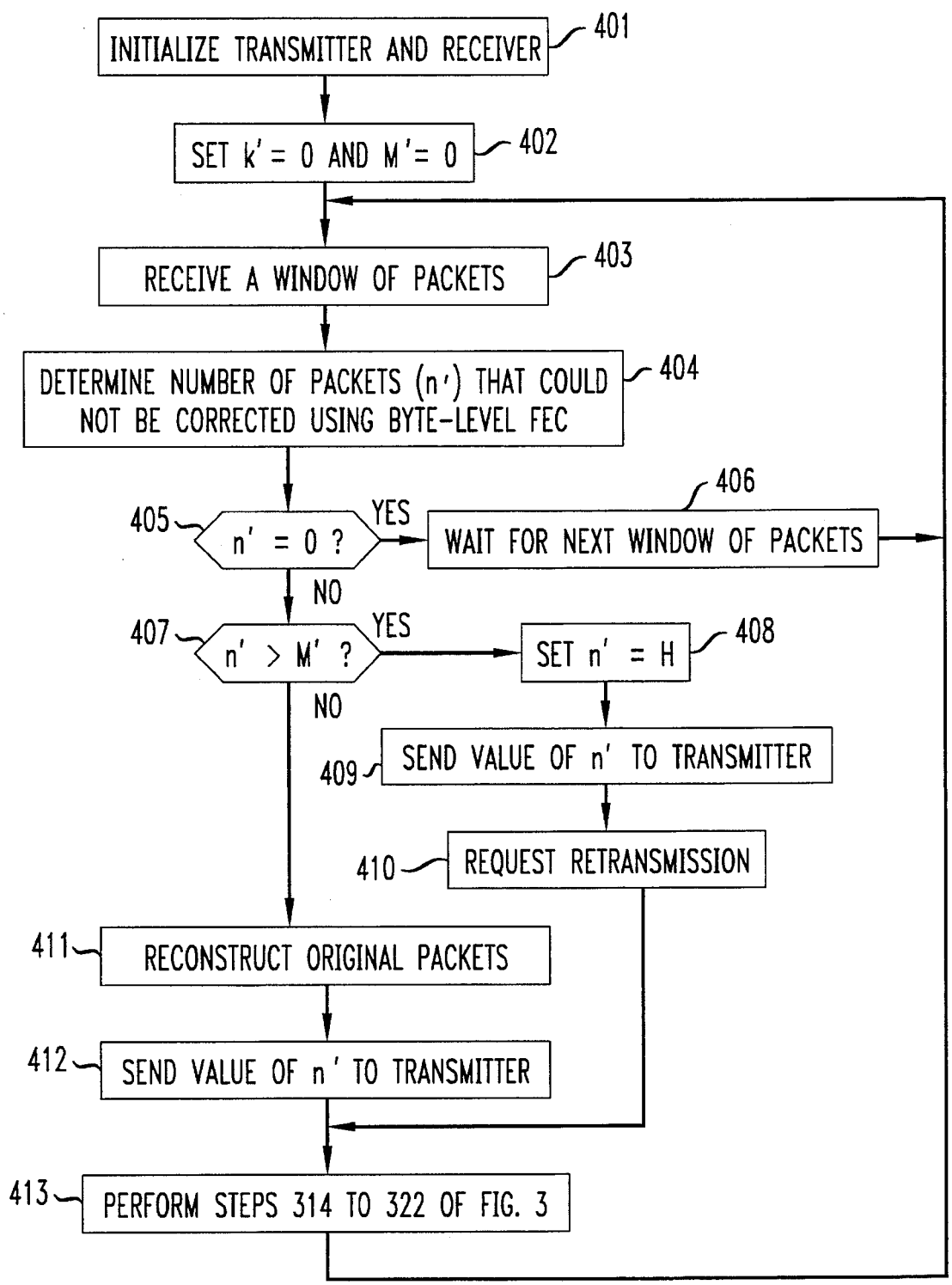

FIG. 4 shows programmed instructions executed by the microprocessors 10 and 20 of FIGS. 1 and 2 to implement adaptive packet-level FEC. When receiver 201 and transmitter 101 are initialized, in step 401, pre-defined parameters, M' and k' are set to zero, in step 402. M' represents a maximum number of errored packets that can be corrected within a single window, while k' is a leaky bucket average of number of errored packets in a window of packets received in receiver 201 and computed thereto. Upon receiving, in step 403, a window of packets from transmitter 101, receiver 201 in step 404 analyzes the number of packets that could not be corrected using the byte-level error correction techniques described above because, for example, n exceeded M. If no errored packets were received, as determined in step 405, receiver 201 in step 406 waits for the next window of packets and repeats steps 403 to 413, as needed. If the number of errored packets in the window n' exceeds M' (n'>M') as determined in step 407, the value of n' that is set to H, in step 408 is transmitted to transmitter 101 in step 409, along with a request for retransmission in step 410. When the number of errored packets in the window is less than the maximum allowed errored packets (n'<M') receiver 201, in step 411 reconstructs the n' errored packets, and in step 412, sends the value of n' to transmitter 101. Subsequently, in step 413, the steps 314 to 322 of FIG. 3 described above are performed with the following modification: 1, n and M are replaced by k', n' and M' and the packet is replaced by the window of packets.

The foregoing is to be construed as only being an illustrative embodiment of this invention. Persons skilled in the art can easily conceive of alternative arrangements providing functionality similar to this embodiment without any deviation from the fundamental principles or the scope of this invention.

We claim:

1. A forward error correction system comprising
   a first device which a) processes a number (N) bytes within each of a plurality of original packets to form a respective forward error correction code of M bytes, b) processes a number (P) of the original packets to form Q additional error correction packets each associated with respective forward error corrections code, and c) transmits said P original packets and said Q additional forward error correction packets as a stream of data as well as their respective forward error correction codes; and a second device which receives the data stream and which a) processes the data stream to correct errors in a received corrupted packet as a function of the respective forward error correction code; b) responsive to errors which cannot be so corrected, processes such errors as a function of the Q additional forward error correction packets to correct said error; and c) responsive to failing to correct such errors, returns a message indicative of said failure and includes in the message a request to expand said forward error correction processing at said first device.

2. The system of claim 1 wherein the second device sends a retransmission request signal for a particular data stream received in said second device when the number of errors detected in the particular data stream exceeds a predetermined threshold.

3. The invention of claim 1 wherein said first device uses a Reed-Solomon encoder.

4. The invention of claim 1 further comprising responsive to receiving the message at the first device, said first device adjusts the number of bytes forming each said forward correction code and the number of forward error correction packets included in subsequent data streams transmitted to said second device.

5. The invention of claim 2 wherein said first device increases the number of bytes M forming respective ones of said forward error correction codes and forward error correction packets Q included in at least one subsequent data stream transmitted to the second device when the number of errors for the most recently received data stream is greater than the number of errors correctable by the second device using the forward error correction code previously set by the first device.

6. The invention of claim 2 wherein said first device decreases the number of bytes M forming each said forward error correction codes, and forward error correction packets Q included in at least one subsequent data stream transmitted to the second device when the number of errors corrected by the second device correctable by the second device using the forward error correction code previously set by the first device.

7. The invention of claim 2 wherein said second device derives an average number of errors corrected for data streams received over a period of time and communicates said average number of errors to the first device to allow the first device to adjust the number of bytes forming a respective forward error correction code and number of forward error correction packets coded in at least one subsequent data stream based on said average number of errors.

8. A forward error correction method comprising the steps of:

encoding in a first device a) N bytes within each of a plurality of P original packets by combining a selected group of bits within said bytes to form M parity bytes and b) the P packets by combining a selected group of bytes within said P packets to form Q parity packets;

transmitting to a second device a data stream of the P+Q packets;

correcting at the second device errors in each corrupted packet in said data stream, said correction being performed to a) reconstruct one or more original bytes within each corrupted packet when less than a predetermined number of bytes is corrupted in said each corrupted packet b) reconstruct said each corrupted packet when a number of corrupted bytes in said each corrupted packet is greater than said predetermined number;

transmitting from the second device to the first device an indication of number of errors corrected in said data stream; and adjusting at the first device the number of parity bytes M, and parity packets Q included in subsequent data streams transmitted to said receiver based on the indication of the number of errors corrected at said receiver.

9. The method of claim 8 wherein said pre-determined number is equal to M/2.

10. The method of claim 8 further comprising the step of decoding in the second device bytes and packets included in said data stream such that as long as N of the N+M bytes are received uncorrupted in the second device for a particular packet, the original N bytes can be reconstructed for said packet O, and when less than N bytes are received uncorrupted, the second device can reconstruct said particular packet as long as Q packets are received uncorrupted.

11. The invention of claim 8 wherein said adjusting step includes the step of:

increasing at the first device the number of parity bytes and parity packets included in at least one subsequent data stream transmitted to the second device based on the number of errors corrected in at least one previous data stream received by the second device.

12. The invention of claim 8 wherein said adjusting step includes the step of:

decreasing the number of parity bytes and parity packets included in at least one subsequent data stream transmitted to the second device based on the number of errors corrected in at least one previous data stream received by the second device.

13. The method of claim 8 further comprising the step of initiating in the second device a retransmission request for the data stream transmitted thereto by the first device when the number of errors detected in the data stream exceeds a predetermined threshold.

14. The method of claim 8 further comprising the steps of deriving at the second device an average number of errors corrected for data streams received over a period of time; and adjusting the number of parity bytes and parity packets coded by said first device in at least one subsequent data stream based on said average number of errors.

15. Apparatus for use in forward error correction procedures, the apparatus comprising:

a receiver which receives at least one data stream received in the receiver, the data stream being which is comprised of a number of independent packets P comprised of original bytes and a number of parity packets Q, said parity packets being formed by a combination of said original bytes within the independent packets each one of said independent packets including a number of parity bytes M that are formed by a combination of bits within each one of said original bytes;

a processor which corrects at least one error in said data stream by a) reconstructing at least one original byte in a particular packet when the number of errors for said particular packet is less than a predetermined threshold number reconstructing said particular packet when the number of errors for said particular exceeds said pre-determined threshold number; and a transmitter which transmits to a device from which said data stream was received information indicative of said at least one corrected error to permit said device to change the number of parity bytes and parity packets included in data streams subsequently transmitted to the apparatus.

16. The apparatus of claim 15 further comprising wherein said processor a) reconstructs one or more original bytes within said particular packet from the uncorrupted bytes received for said particular packet in the data stream when said predetermined threshold number is less than M, and b) reconstructs said particular packet when said predetermined threshold number is greater than M and the number of packets received uncorrupted is equal to or greater than P.

17. A method of using a receiver for forward error correction procedures, the method comprising the steps of:

receiving at the receiver at least one data stream which is comprised of a number of independent packets and a number of parity packets that are formed by a combination of bytes of the independent packets, each one of said independent packets including a number of parity bytes that are formed by a combination of bits within each one of said bytes correcting at least one error in said data stream by a) reconstructing at least one byte in a particular packet when the number of errors for said particular packet is less than a predetermined number and b) reconstructing said particular packet when the number of errors for said particular packet exceeds said predetermined number; and communicating to a device from which said data stream was received, information indicative of said at least one corrected error to permit said device to change the number of parity bytes and parity packets included in subsequent data streams transmitted to the receiver.

18. The method of claim 17 further comprising the step of:

reconstructing one or more original bytes within said particular packet from the uncorrupted bytes received for said particular packet in the data stream when said predetermined threshold number is less than M, and b) reconstructs said particular packet when said predetermined threshold number is greater than M and the number of packets received uncorrupted is equal to or greater than P.

* * * * *